United States Patent
Amundson et al.

(10) Patent No.: US 6,750,473 B2
(45) Date of Patent: Jun. 15, 2004

(54) TRANSISTOR DESIGN FOR USE IN THE CONSTRUCTION OF AN ELECTRONICALLY DRIVEN DISPLAY

(75) Inventors: Karl R. Amundson, Cambridge, MA (US); Gregg Duthaler, Brookline, MA (US); Paul S. Drzaic, Lexington, MA (US)

(73) Assignee: E-Ink Corporation, Cambridge, MA (US)

( * ) Notice: Subject to any disclaimer, the term of this patent is extended or adjusted under 35 U.S.C. 154(b) by 0 days.

(21) Appl. No.: 10/354,721

(22) Filed: Jan. 30, 2003

(65) Prior Publication Data

US 2003/0141500 A1 Jul. 31, 2003

Related U.S. Application Data

(62) Division of application No. 09/650,620, filed on Aug. 30, 2000, now Pat. No. 6,545,291.
(60) Provisional application No. 60/151,549, filed on Aug. 31, 1999.

(51) Int. Cl.[7] .......... H01L 35/24; H01L 29/04; H01L 29/06; H01L 47/00; H01L 51/00

(52) U.S. Cl. .............. 257/40; 257/4; 257/20; 257/32; 257/59; 257/72

(58) Field of Search .............. 257/40, 20, 4, 257/59, 32, 72

(56) References Cited

U.S. PATENT DOCUMENTS

| | | | | |
|---|---|---|---|---|
| 3,967,305 A | * | 6/1976 | Zuleeg ................... 257/8 |
| 4,087,795 A | * | 5/1978 | Rossler ................. 365/185.29 |
| 4,439,507 A | | 3/1984 | Pan et al. ................ 430/59 |
| 4,502,934 A | | 3/1985 | Gazard et al. ........... 204/242 |
| 4,543,306 A | | 9/1985 | Dubois et al. .......... 429/194 |
| 4,543,320 A | * | 9/1985 | Vijan .................... 430/314 |
| 4,783,147 A | * | 11/1988 | Maurice et al. .......... 349/43 |
| 4,909,959 A | | 3/1990 | Lemaire et al. ......... 252/500 |
| 5,006,212 A | | 4/1991 | DiSanto et al. ........ 204/192.14 |
| 5,059,694 A | | 10/1991 | Delabouglise et al. ..... 548/518 |
| 5,132,049 A | | 7/1992 | Garreau et al. ......... 252/500 |
| 5,149,826 A | | 9/1992 | Delabouglise et al. ..... 548/518 |

(List continued on next page.)

FOREIGN PATENT DOCUMENTS

| EP | 0 396 937 A2 | 11/1990 |
|---|---|---|
| EP | 0 402 269 A1 | 12/1990 |

(List continued on next page.)

OTHER PUBLICATIONS

Bao, Z., et al., "High–Performance Plastic Transistors Fabricated by Printing Techniques," *American Chemical Society*, 1997, pp. 1299–1301.

(List continued on next page.)

*Primary Examiner*—David Nelms
*Assistant Examiner*—Ly Duy Pham
(74) *Attorney, Agent, or Firm*—Testa, Hurwitz & Thibeault, LLP (57) ABSTRACT

A transistor having a channel width, W, and a channel length, L, defined by non-rectangular electrodes. The transistor is a thin film field effect transistor having an insulated gate electrode. One of a source and drain electrodes is connected to a display electrode and one is connected to a data line. The source and drain electrodes can be interdigitated to provide a desired W/L ratio. The gate is connected to a select line. An overlap region between a display electrode and a select line for another pixel defines a capacitor. The transistor is fabricated to be situated behind the display electrode so as to maximize an aperture ratio. The design enables the use of conventional printing methods, such as screen printing, ink jet printing, printing through a stencil, flexo-gravure printing and offset printing.

8 Claims, 4 Drawing Sheets

US 6,750,473 B2

Page 2

U.S. PATENT DOCUMENTS

| | | | | |
|---|---|---|---|---|
| 5,204,424 A | | 4/1993 | Roncali et al. | 526/256 |
| 5,268,448 A | | 12/1993 | Buechner et al. | 528/380 |
| 5,302,987 A | * | 4/1994 | Kanemori et al. | 349/143 |
| 5,347,144 A | | 9/1994 | Garnier et al. | 257/40 |
| 5,508,533 A | * | 4/1996 | Takemura | 257/64 |
| 5,536,932 A | | 7/1996 | Hack et al. | |
| 5,563,432 A | * | 10/1996 | Miura et al. | 257/291 |
| 5,574,291 A | | 11/1996 | Dodabalapur et al. | 257/40 |
| 5,583,369 A | | 12/1996 | Yamazaki et al. | |
| 5,596,208 A | | 1/1997 | Dodabalapur et al. | 257/66 |
| 5,599,695 A | * | 2/1997 | Pease et al. | 435/91.1 |
| 5,610,737 A | * | 3/1997 | Akiyama et al. | 349/47 |
| 5,612,565 A | * | 3/1997 | Kusumoto | 257/401 |
| 5,614,427 A | | 3/1997 | den Boer et al. | |
| 5,625,199 A | | 4/1997 | Baumbach et al. | 257/40 |
| 5,659,181 A | | 8/1997 | Bridenbaugh et al. | 257/40 |
| 5,693,977 A | | 12/1997 | Haddon et al. | 257/431 |
| 5,705,826 A | | 1/1998 | Aratani et al. | 257/40 |
| 5,721,164 A | | 2/1998 | Wu | |
| 5,733,804 A | | 3/1998 | Hack et al. | |
| 5,764,206 A | * | 6/1998 | Koyama et al. | 345/80 |
| 5,796,116 A | * | 8/1998 | Nakata et al. | 257/66 |
| 5,828,082 A | | 10/1998 | Wu | |
| 5,834,344 A | * | 11/1998 | Cheng | 438/158 |
| 5,835,168 A | * | 11/1998 | Takeda et al. | 349/38 |
| 5,847,413 A | | 12/1998 | Yamanzaki et al. | 257/69 |
| 5,874,746 A | | 2/1999 | Holmberg et al. | 257/59 |
| 5,880,797 A | * | 3/1999 | Yamada et al. | 349/84 |
| 5,914,762 A | * | 6/1999 | Lee et al. | 349/141 |
| 5,917,199 A | | 6/1999 | Byun et al. | |
| 5,917,210 A | | 6/1999 | Huang et al. | |
| 5,919,532 A | * | 7/1999 | Sato et al. | 428/1.6 |
| 5,936,259 A | | 8/1999 | Katz et al. | 257/40 |
| 5,946,561 A | | 8/1999 | Yamazaki et al. | |
| 5,962,896 A | * | 10/1999 | Yabuta et al. | 257/347 |
| 5,969,376 A | | 10/1999 | Bao | 257/40 |
| 6,005,791 A | | 12/1999 | Gudesen et al. | 365/114 |
| 6,005,817 A | | 12/1999 | Gudesen et al. | 365/215 |
| 6,008,269 A | * | 12/1999 | Kitagawa et al. | 522/44 |
| 6,017,584 A | * | 1/2000 | Albert et al. | 427/213.3 |
| 6,019,796 A | | 2/2000 | Mei et al. | |
| 6,020,223 A | | 2/2000 | Mei et al. | |
| 6,034,747 A | * | 3/2000 | Tanaka et al. | 349/43 |
| 6,107,117 A | | 8/2000 | Bao et al. | |
| 6,136,128 A | * | 10/2000 | Chung | 156/235 |
| 6,165,383 A | * | 12/2000 | Chou | 252/301.16 |
| 6,197,663 B1 | | 3/2001 | Chandross et al. | |
| 6,265,249 B1 | | 7/2001 | Wu | |
| 6,274,412 B1 | | 8/2001 | Kydd et al. | |
| 6,278,142 B1 | | 8/2001 | Hynecek | |
| 6,312,304 B1 | | 11/2001 | Duthaler et al. | |
| 6,323,989 B1 | * | 11/2001 | Jacobson et al. | 359/296 |
| 6,433,487 B1 | * | 8/2002 | Yamazaki | 315/169.3 |
| 6,451,636 B1 | * | 9/2002 | Segawa et al. | 438/166 |
| 6,489,632 B1 | * | 12/2002 | Yamazaki et al. | 257/66 |
| 6,504,175 B1 | * | 1/2003 | Mei et al. | 257/66 |
| 6,529,251 B2 | * | 3/2003 | Hibino et al. | 349/42 |
| 2001/0003477 A1 | * | 6/2001 | Aoki et al. | 349/152 |
| 2001/0045934 A1 | * | 11/2001 | Turner et al. | 345/107 |
| 2002/0018881 A1 | * | 2/2002 | Terashita et al. | 428/209 |

FOREIGN PATENT DOCUMENTS

| | | | | |
|---|---|---|---|---|
| EP | 0 442 123 A1 | 8/1991 | | |
| EP | 0 240 063 B1 | 1/1992 | | |
| EP | 0 323 656 B1 | 4/1993 | | |
| EP | 0 537 240 B1 | 9/1993 | | |
| EP | 0 375 005 B1 | 9/1994 | | |
| EP | 0 408 105 B1 | 1/1995 | | |
| EP | 0 802 217 A2 | 10/1997 | | |
| EP | 0 825 657 A2 | 2/1998 | | |
| EP | 0 852 403 A1 | 7/1998 | | |
| EP | 0 962 984 A2 | 12/1999 | | |
| EP | 0 981 165 A1 | 2/2000 | | |
| JP | 09090424 A | * | 4/1997 | G02F/1/136 |
| JP | 09152628 A | * | 6/1997 | G02F/1/136 |
| JP | 10135481 A | | 5/1998 | |
| JP | 10142628 | | 5/1998 | |
| JP | 10190001 | | 7/1998 | |
| JP | 11195790 | | 7/1999 | |
| JP | 2001036087 A | * | 2/2001 | H01L/29/786 |
| WO | 90/08402 | | 7/1990 | |
| WO | 98/03896 | | 1/1998 | G02F/1/133 |
| WO | 98/12585 | | 3/1998 | |
| WO | 98/55897 | | 12/1998 | |
| WO | 99/10939 | | 3/1999 | |
| WO | 99/14762 | | 3/1999 | |
| WO | 99/14763 | | 3/1999 | |
| WO | 99/44229 | | 9/1999 | |
| WO | 99/53371 | | 10/1999 | |
| WO | 99/63527 | | 12/1999 | |
| WO | 99/66540 | | 12/1999 | |
| WO | 99/66551 | | 12/1999 | |
| WO | 00/08689 | | 2/2000 | |

OTHER PUBLICATIONS

Bao, Z., et al., "Soluble and processable regloregular poly(3–hexylthiophene) for thin film field–effect transistor applications with high mobility," *American Institute of Physics*, 1996, pp. 4108–4110.

Clarisse, et al., "Field–Effect Transistor with Diphthalocyanine Thin Film," *Electronics Letters*, May 26, 1988, vol. 24, No. 11, pp. 673–675.

Dodabalapur et al., "Organic Smart Pixels," *Applied Physics*, Jun. 13, 1998, vol. 73, No. 2; XP–000771188.

Drobac, S., "Fluidic Self–Assembly Could Change the Way FPDs Are Made," *Information Display*, 1999, pp. 12–16.

Garnier et al., "All–Polymer Field–Effect Transistor Realized by Printing Techniques," *Science*, Sep. 16, 1994, vol. 265; XP–000783907.

Horowitz, G., "Organic Field–Effect Transistors," *Advanced Materials*, 1998, pp. 365–377.

Koezuka et al., "Macromolecular Electronic Device," *Mol. Cryst. Liq. Cryst*, 1994, vol. 255, pp. 221–230; XP–002055362.

Lu, et al., "Studies of Polymer–based Field Effect Transistors," *IEEE*, 1993, pp. 814–816.

Masui, M., "Effect of Crystallinity on Electrical Conductivity of α Cu–Phthalocyanine Film," pp. 371–374.

McCullough, R., "The Chemistry of Conducting Polythiophenes," *Advanced Materials*, 1998, pp. 93–116.

Ridley, et al., "All–Inorganic Field Effect Transistors Fabricated by Printing," *Science*, Oct. 22, 1999, vol. 286, pp. 746–748.

Schlemmer, S., et al., "The Unidentified Interstellar Infrared Bands: PAHS as Carriers?" *Science*, Sep. 16, 1994, vol. 265, pp. 1684–1686.

Torsi et al., "Charge Transport in Oligothiophene Field–Effect Transistors," *The American Physical Society*, Jan. 15, 1998, vol. 57, No. 4; XP–000769614.

Torsi, L., et al., "Organic Thin–Film Transistors with High on/off Ratios," *Materials Research Society*, 1996 pp. 695–700.

* cited by examiner

TRANSISTOR DESIGN FOR USE IN THE CONSTRUCTION OF AN ELECTRONICALLY DRIVEN DISPLAY

CROSS-REFERENCE TO RELATED APPLICATIONS

This application is a divisional of and claims priority to U.S. patent application Ser. No. 09/650,620, filed Aug. 30, 2000, now U.S. Pat. No. 6,545,291, which claims the benefit of U.S. Provisional Patent application Serial No. 60/151,549, filed Aug. 31, 1999.

FIELD OF THE INVENTION

The present invention relates to a transistor design, and more specifically, to a design of printed organic transistors for addressing an electronic display.

BACKGROUND OF THE INVENTION

It is advantageous to include one or more thin film transistor(s) at each pixel in the circuitry for electronic addressing of some displays. Most notably, active matrix drive schemes usually include a thin-film transistor (TFT) at each pixel. The TFT acts as a non-linear element on the backplane of a display and permits application of advantageous electronic signals at each pixel for driving a display. For example, active matrix backplanes are routinely used to drive liquid crystal displays, especially those with a large number of rows and columns of pixels.

Enhancement mode field effect transistors (FETs) are well known. In an enhancement mode FET, no current flows between the source and the drain of the FET when zero potential or voltage is applied to the gate terminal. The current increases as the magnitude of the gate voltage is increased in the appropriate sense, by virtue of the presence of mobile charges induced within the channel. Depletion mode FETs are also known, in which the maximum conductivity, and hence current flow, occurs for zero applied gate voltage, and an increase in the gate voltage in the appropriate sense causes the source-drain current to diminish by virtue of a reduction of the free carrier charge density within the channel. Applying small voltages of the inappropriate sense to either device has an insignificant effect on the device. Applying large voltages of either sense can damage the device permanently. Depletion mode FETs can operate in enhancement mode if moderate gate voltages of the "wrong" or "reverse" polarity are applied to them, because the reverse gate voltage induces additional mobile charges into the channel of the FET. However, reversed gate voltages applied to enhancement mode FETs cannot significantly reduce the already insignificant number of mobile carriers, so no readily observable response is forthcoming.

Two carrier types are also known. In n-channel FETs the dominant carrier type comprises electrons, and in p-channel FETs the dominant carrier type comprises holes. Both n-channel and p-channel FETs can be fabricated as either enhancement mode or depletion mode devices.

Thin film transistor performance depends upon material characteristics as well as the geometry of the transistor. The conductance between the source and the drain of a field effect transistor depends upon the gate voltage ($V_g$), the drain-source voltage ($V_{ds}$), and a threshold voltage of the device ($V_T$). $V_T$ is positive for enhancement mode FETs, and is negative for depletion mode FETs. For n-type enhancement mode FETs, the conductance increases with increasingly positive gate voltage, and with increasing drain-source voltage. When $V_{ds}$, for ($V_{ds} > 0$), exceeds the quantity ($V_{GS} - V_T$) in magnitude, the FET is in saturation (i.e., fully into accumulation mode), and the saturated drain current ($I_{DS}^{sat}$) is given approximately by:

$$I_{DS}^{sat} = \frac{W}{2L} C_g \mu (V_G - V_T)^2 \quad (1)$$

where $V_T$ is the threshold voltage, $C_g$ is the capacitance per area of the gate insulator, $\mu$ is the field effect mobility of the dominant charge carrier, and W and L are the channel width and length, respectively (see FIG. 2). $I_{DS}$ depends upon the conductivity of the semiconductor as well as the dimensions of the FET. For a p-channel enhancement mode FET, the voltage senses are reversed from those in an n-channel enhancement mode FET.

SUMMARY OF THE INVENTION

In this disclosure a pixel layout is detailed that includes a novel transistor design that can enable alternative processing schemes for fabricating the backplane as well as enabling the use of active matrix backplanes in certain types of displays where a large amount of current is needed to drive each pixel.

In one aspect, the invention features a transistor for use with an electronic display comprising a plurality of pixels. The transistor comprises a substrate, a gate electrode and a gate dielectric in contact with the gate electrode, a semiconductor layer, and a pixel electrode and a data line electrode in contact with the semiconductor layer. The pixel electrode and the data line electrode define a channel, the channel has a length, defined as the distance between the pixel and data line electrodes, greater than about 10 microns, and preferably about 25 microns.

In one embodiment, the gate electrode is adjacent the substrate, the gate dielectric is adjacent the gate electrode, the semiconductor layer is adjacent the gate dielectric, and the pixel and data line electrodes are adjacent the semiconductor layer. In another embodiment, the gate electrode is adjacent the substrate, the gate dielectric is adjacent the gate electrode, the pixel and data line electrodes are adjacent the gate dielectric, and the semiconductor is adjacent the pixel and data line electrodes. In still another embodiment, the pixel and data line electrodes are adjacent the substrate, the semiconductor layer is adjacent the pixel and data line electrodes, the gate dielectric is adjacent the semiconductor layer, and the gate electrode is adjacent the gate dielectric. In still another embodiment, the semiconductor layer is adjacent the substrate, the pixel and data line electrodes are adjacent the semiconductor layer, the gate dielectric is adjacent the semiconductor layer, and the gate electrode is adjacent the gate dielectric.

In one embodiment, the pixel electrode is a selected one of a source electrode and a drain electrode of the transistor. In one embodiment, the pixel electrode and the data line electrode are interdigitated. In one embodiment the data line electrode comprises a data line of the display.

In another embodiment, the pixel electrode and the data line electrode are constructed so as to define a spiral shape therebetween. In another embodiment, the pixel electrode and the data line electrode define a transistor channel that is a non-rectilinear shape. In one embodiment, the transistor is a field effect transistor.

In one embodiment, the semiconductor layer comprises an organic semiconductor layer. For example, the semiconductor layer can comprise regioregular poly(3-hexyl thiophene), polythiophene, poly(3-alkylthiophene), alkyl-substituted oligothiophene, polythienylenevinylene, poly (para-phenylenevinylene) and doped versions of these polymers, and oligomeric semiconductors such as alpha-hexathienylene.

In one embodiment, the shape of the channel provides a given W/L ratio when the value of the dimension L is defined by a deposition technology chosen from screen printing, stencil printing, ink jet printing, flexo-gravure printing and offset printing. The shape of the channel can provide a W/L ratio that is selected based upon the majority carrier conductivity of a semiconductor. Alternatively, the shape of the channel can provide a W/L ratio that is selected based upon the minority carrier conductivity of a semiconductor.

In another aspect, the invention features an electronic display drive circuit. The electronic display drive circuit comprises a display electrode, an insulator disposed adjacent the display electrode, and a transistor placed adjacent to the insulator substantially underneath the display electrode for addressing the display electrode. The insulator can be at least five microns in thickness. The insulator insulates a pixel electrode and a data line electrode of the transistor from the display electrode except for a region of electrical contact between the pixel electrode of the transistor and the display electrode.

In one embodiment, the transistor comprises a pixel electrode and a data line electrode, a semiconductor layer adjacent the pixel electrode and data line electrode, a gate electrode and a gate dielectric separating the semiconductor from the gate electrode.

In one embodiment, the pixel electrode and the data line electrode are interdigitated. In another example, the electronic display further comprises a plurality of data lines and select lines, wherein extensions of the data lines form a plurality of data line electrodes and extensions of the select lines form a plurality of gate electrodes. In still another example, the gate electrode comprises a bar and fingers extending from the bar.

In another embodiment, the pixel electrode and the data line electrode jointly define a channel having a spiral shape. In still another embodiment, the pixel electrode and the data line electrode define a transistor channel that is a non-rectilinear shape. In one embodiment, the channel between the pixel electrode and the data line electrode has a length greater than about 25 microns.

In one embodiment, the semiconductor layer comprises an organic semiconductor layer. For example, the semiconductor layer can comprises regioregular poly(3-hexyl thiophene).

In one embodiment, the electronic display drive circuit further comprises a storage capacitor comprising a portion of the pixel electrode and a portion of a select line or another conductive element near the pixel electrode. In one example, the storage capacitor further comprises a portion of the insulator disposed between the portion of the pixel electrode and the portion of the select line or another conductive element near the pixel electrode.

In another embodiment, the electronic display further comprises a display media comprising one of electrophoretic particles, rotating balls, suspended needles, and bichromal spheres. Alternatively, the electronic display further comprises a display media comprising liquid crystals or electroluminescent particles. In another embodiment, the electronic display further comprises a light emitting diode.

In one aspect, the invention features a method of fabricating a transistor, comprising the step of printing at least one structural element of a transistor, using a process chosen from screen printing, ink jet printing, printing through a stencil, flexo-gravure printing and offset printing. In one embodiment, the step of printing comprises printing a first electrode and a second electrode, said first electrode and said second electrode defining in a semiconductor a channel having a length L of at least 10 microns. In one embodiment, the channel length L is at least about 25 microns. In another embodiment, the channel is non-rectangular in shape.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 2A shows in side view.

FIG. 4A shows in plan view.

FIG. 5A shows in plan view.

DETAILED DESCRIPTION

The transistor design of the invention is particularly useful in addressing electrophoretic displays.

Electrophoretic displays have been the subject of intense research and development for a number of years. Electrophoretic displays have attributes of good brightness and contrast, wide viewing angles, state bistability, and low power consumption when compared with liquid crystal displays. Nevertheless, problems with the long-term image quality of these displays have prevented their widespread usage. For example, particles that make up such displays tend to cluster and settle, resulting in inadequate service-life for these displays.

An encapsulated electrophoretic display typically does not suffer from the clustering and settling failure mode of traditional electrophoretic devices and provides further advantages, such as the ability to print or coat the display on a wide variety of flexible and rigid substrates. Use of the word "printing" is intended to include all forms of printing and coating, including, but without limitation: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes and other similar techniques. Thus, the resulting display can be flexible. Further, because the display media can be printed (using a variety of methods), the display itself can be made inexpensively.

In broad overview, the invention relates to encapsulated electrophoretic displays that provide a flexible, reflective display that can be manufactured easily and consume little power (or no power in the case of bistable displays in certain states), as well as materials and methods useful in their construction. Such displays, therefore, can be incorporated into a variety of applications. The display can be formed from and can include particles that move in response to an electric charge. This mode of operation is typical in the field of electrophoretic displays. A display in which the particles, ordered by an electric charge, take on a certain configuration can take on many forms. Once the electric field is removed, the particles can be generally stable (e.g., bistable). Additionally, providing a subsequent electric charge can alter a prior configuration of particles. Some encapsulated electrophoretic displays may include two or more different types of particles. Such displays may include, for example, displays containing a plurality of anisotropic particles and a plurality of second particles in a suspending fluid. Application of a first electric field may cause the anisotropic particles to assume a specific orientation and present an optical property. Application of a second electric field may then cause the plurality of second particles to translate, thereby disorienting the anisotropic particles and disturbing the optical property. Alternatively, the orientation of the anisotropic particles may allow easier translation of the plurality of second particles. The particles may have a refractive index that substantially matches the refractive index of the suspending fluid.

An encapsulated electrophoretic display can be constructed so that the optical state of the display is stable for some length of time. When the display has two states that are stable in this manner, the display is bistable. If more than two states of the display are stable, then the display is multistable. For the purpose of the present invention, the term bistable indicates a display in which any optical state remains fixed once the addressing voltage is removed. However, the definition of a bistable state depends upon the display's application. A slowly decaying optical state can be effectively bistable if the optical state is substantially unchanged over the required viewing time. For example, in a display that is updated every few minutes, a display image that is stable for hours or days is effectively bistable for a particular application. Thus, for purposes of the present invention, the term bistable also indicates a display with an optical state sufficiently long-lived so as to be effectively bistable for a particular application. Alternatively, it is possible to construct encapsulated electrophoretic displays in which the image decays quickly once the addressing voltage to the display is removed (i.e., the display is not bistable or multistable). Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may include capsules dispersed in a binder. The capsules may be of any size or shape. The capsules may, for example, be spherical and may have diameters in the millimeter range or the micron range, but are preferably from about ten to about a few hundred microns. The capsules may be formed by an encapsulation technique. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further include a suspending fluid in which the particles are dispersed.

Generally, an encapsulated electrophoretic display includes a capsule with one or more species of particle that either absorb or scatter light and that are suspended in a fluid. One example is a system in which the capsules contain one or more species of electrophoretically mobile particles dispersed in a dyed suspending fluid. Another example is a system in which the capsules contain two separate species of particles suspended in a clear suspending fluid, in which one species of particle absorbs light (black), while the other species of particle scatters light (white). There are other extensions (more than two species of particles, with or without a dye, etc.). The particles are commonly solid pigments, dyed particles, or pigment/polymer composites.

In electrophoretic displays, the particles may be oriented or translated by placing an electric field across the capsule. The electric field may include an alterating-current field or a direct-current field. The electric field may be provided by at least one pair of electrodes disposed adjacent to a display comprising the capsule.

The successful construction of an encapsulated electrophoretic display requires the proper interaction of all these materials and processes. Materials such as a polymeric binder (for example, for binding the capsules to a substrate), electrophoretic particles, fluid (for example, to surround the electrophoretic particles and provide a medium for migration), and a capsule membrane (for example, for enclosing the electrophoretic particles and fluid) must all be chemically compatible. The capsule membranes may engage in useful surface interactions with the electrophoretic particles, or may act as an inert physical boundary between the fluid and the binder. Polymer binders may set as adhesives between capsule membranes and electrode surfaces.

Various materials may be used to create electrophoretic displays. Selection of these materials is based on the functional constituents of the display to be manufactured. Such functional constituents include, but are not limited to, particles, dyes, suspending fluids, stabilizing/charging additives, and binders. In one embodiment, types of particles that may be used to fabricate suspended particle displays include scattering pigments, absorbing pigments and luminescent particles. Such particles may also be transparent. Exemplary particles include titania, which may be coated in one or two layers with a metal oxide, such as aluminum oxide or silicon oxide, for example. Such particles may be constructed as corner cubes. Luminescent particles may include, for example, zinc sulfide particles. The zinc sulfide particles may also be encapsulated with an insulative coating to reduce electrical conduction. Light-blocking or absorbing particles may include, for example, dyes or pigments. Types of dyes for use in electrophoretic displays are commonly known in the art. Useful dyes are typically soluble in the suspending fluid, and may further be part of a polymeric chain. Dyes may be polymerized by thermal, photochemical, and chemical diffusion processes. Single dyes or mixtures of dyes may also be used.

A suspending (i.e., electrophoretic) fluid may be a high resistivity fluid. The suspending fluid may be a single fluid, or it may be a mixture of two or more fluids. The suspending fluid, whether a single fluid or a mixture of fluids, may have its density substantially matched to that of the particles within the capsule. The suspending fluid may be halogenated hydrocarbon, such as tetrachloroethylene, for example. The halogenated hydrocarbon may also be a low molecular weight polymer. One such low molecular weight polymer is poly(chlorotrifluoroethylene). The degree of polymerization for this polymer may be from about 2 to about 10.

Furthermore, capsules may be formed in, or later dispersed in, a binder. Materials for use as binders include water-soluble polymers, water-dispersed polymers, oil-soluble polymers, thermoset polymers, thermoplastic polymers, and UV- or radiation-cured polymers.

While the examples described here are listed using encapsulated electrophoretic displays, there are other particle-based display media that also should work well, including encapsulated suspended particles and rotating ball displays. Other display media, such as liquid crystals and magnetic particles, also can be useful.

In some cases, a separate encapsulation step of the process is not necessary. The electrophoretic fluid may be directly dispersed or emulsified into the binder (or a precursor to the binder material) to form what may be called a "polymer-dispersed electrophoretic display." In such displays, the individual electrophoretic phases may be referred to as capsules or microcapsules even though no capsule membrane is present. Such polymer-dispersed electrophoretic displays are considered to be subsets of encapsulated electrophoretic displays.

In an encapsulated electrophoretic display, the binder material surrounds the capsules and separates the two bounding electrodes. This binder material must be compatible with the capsule and bounding electrodes and must possess properties that allow for facile printing or coating. It may also possess barrier properties for water, oxygen, ultraviolet light, the electrophoretic fluid, or other materials. Further, it may contain surfactants and cross-linking agents, which could aid in coating or durability. The polymer dispersed electrophoretic display may be of the emulsion or phase separation type.

Figure 1A:
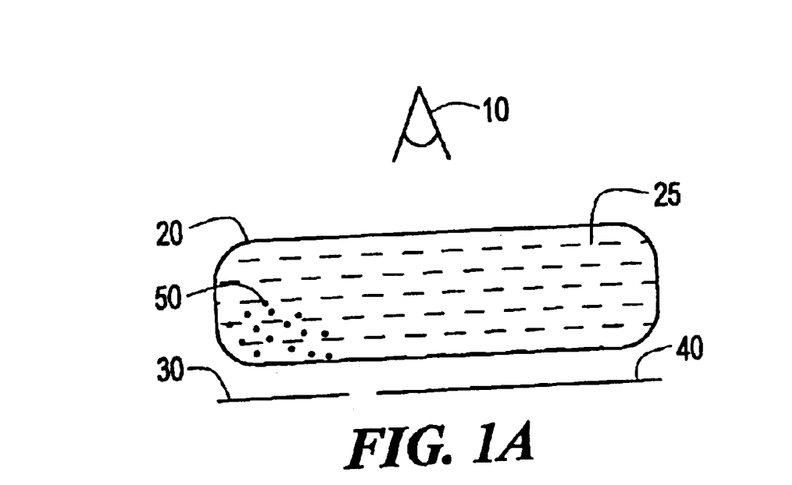
FIG. 1A is a diagrammatic side view of an embodiment of a rear-addressing electrode structure for a particle-based display in which the smaller electrode has been placed at a voltage relative to the large electrode causing the particles to migrate to the smaller electrode.

FIG. 1A depicts a single capsule 20 of an encapsulated display media. In brief overview, the embodiment depicted in FIG. 1A includes a capsule 20 containing at least one particle 50 dispersed in a suspending fluid 25. The capsule 20 is addressed by a first electrode 30 and a second electrode 40. The first electrode 30 is smaller than the second electrode 40. The first electrode 30 and the second electrode 40 may be set to voltage potentials which affect the position of the particles 50 in the capsule 20.

The particles 50 represent 0.1% to 20% of the volume enclosed by the capsule 20. In some embodiments the particles 50 represent 2.5% to 17.5% of the volume enclosed by capsule 20. In preferred embodiments, the particles 50 represent 5% to 15% of the volume enclosed by the capsule 20. In more preferred embodiments the particles 50 represent 9% to 11% of the volume defined by the capsule 20. In general, the volume percentage of the capsule 20 that the particles 50 represent should be selected so that the particles 50 expose most of the second, larger electrode 40 when positioned over the first, smaller electrode 30. As described in detail below, the particles 50 may be colored any one of a number of colors. The particles 50 may be either positively charged or negatively charged.

The particles 50 are dispersed in a dispersing fluid 25. The dispersing fluid 25 should have a low dielectric constant. The fluid 25 may be clear, or substantially clear, so that the fluid 25 does not inhibit viewing the particles 50 and the electrodes 30, 40 from position 10. In other embodiments, the fluid 25 is dyed. In some embodiments the dispersing fluid 25 has a specific gravity matched to the density of the particles 50. These embodiments can provide a bistable display media, because the particles 50 do not tend to move in certain compositions absent an electric field applied via the electrodes 30, 40.

Figure 1B:
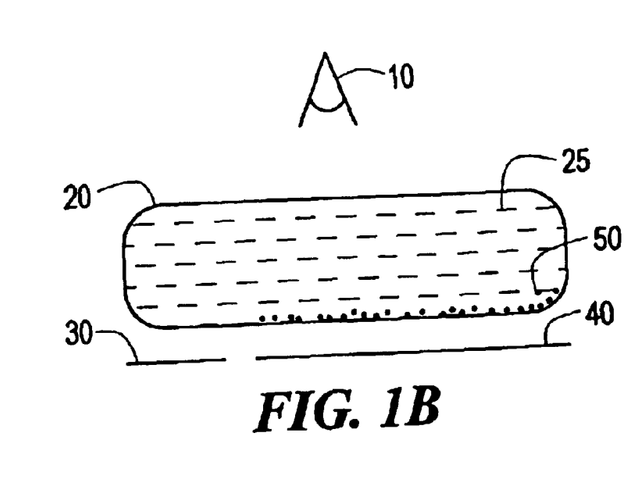
FIG. 1B is a diagrammatic side view of an embodiment of a rear-addressing electrode structure for a particle-based display in which the larger electrode has been placed at a voltage relative to the smaller electrode causing the particles to migrate to the larger electrode.
Figure 1C:
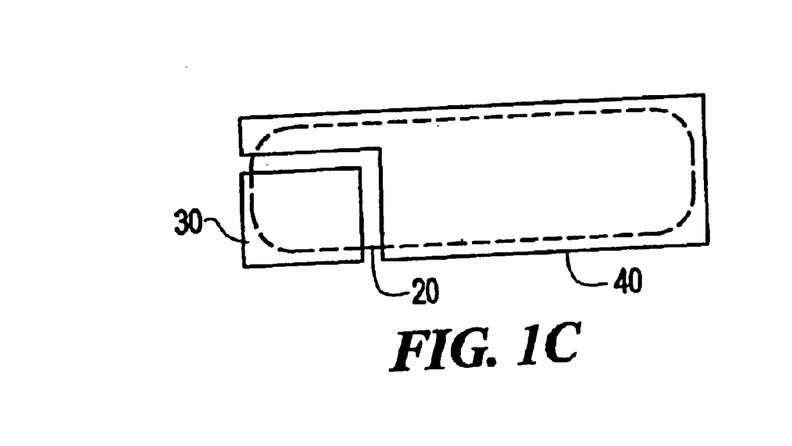
FIG. 1C is a diagrammatic top-down view of one embodiment of a rear-addressing electrode structure.

The electrodes 30, 40 should be sized and positioned appropriately so that together they address the entire capsule 20. There may be exactly one pair of electrodes 30, 40 per capsule 20, multiple pairs of electrodes 30, 40 per capsule 20, or a single pair of electrodes 30, 40 may span multiple capsules 20. In the embodiment shown in FIGS. 1A and 1B, the capsule 20 has a flattened, rectangular shape. In these embodiments, the electrodes 30, 40 should address most, or all, of the flattened surface area adjacent the electrodes 30, 40. The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40. It should be noted that reference to "smaller" in connection with the electrode 30 means that the electrode 30 addresses a smaller amount of the surface area of the capsule 20, not necessarily that the electrode 30 is physically smaller than the larger electrode 40. For example, multiple capsules 20 may be positioned such that less of each capsule 20 is addressed by the "smaller" electrode 30, even though both electrodes 30, 40 are equal in size. It should also be noted that, as shown in FIG. 1C, electrode 30 may address only a small corner of a rectangular capsule 20 (shown in phantom view in FIG. 1C), requiring the larger electrode 40 to surround the smaller electrode 30 on two sides in order to properly address the capsule 20. Selection of the percentage volume of the particles 50 and the electrodes 30, 40 in this manner allow the encapsulated display media to be addressed as described below.

Electrodes may be fabricated from any material capable of conducting electricity so that electrode 30, 40 may apply an electric field to the capsule 20. As noted above, the rear-addressed embodiments depicted in FIGS. 1A and 1B allow the electrodes 30, 40 to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiophenes. Electrodes 30, 40 may be provided with contrasting optical properties. In some embodiments, one of the electrodes has an optical property complementary to optical properties of the particles 50.

In one embodiment, the capsule 20 contains positively charged black particles 50, and a substantially clear suspending fluid 25. The first, smaller electrode 30 is colored black, and is smaller than the second electrode 40, which is colored white or is highly reflective. When the smaller, black electrode 30 is placed at a negative voltage potential relative to larger, white electrode 40, the positively-charged particles 50 migrate to the smaller, black electrode 30. The effect to a viewer of the capsule 20 located at position 10 is a mixture of the larger, white electrode 40 and the smaller, black electrode 30, creating an effect which is largely white. Referring to FIG. 1B, when the smaller, black electrode 30 is placed at a positive voltage potential relative to the larger, white electrode 40, particles 50 migrate to the larger, white electrode 40 and the viewer is presented a mixture of the black particles 50 covering the larger, white electrode 40 and the smaller, black electrode 30, creating an effect which is largely black. In this manner the capsule 20 may be addressed to display either a white visual state or a black visual state.

Other two-color schemes are easily provided by varying the color of the smaller electrode 30 and the particles 50 or by varying the color of the larger electrode 40. For example, varying the color of the larger electrode 40 allows fabrication of a rear-addressed, two-color display having black as one of the colors. Alternatively, varying the color of the smaller electrode 30 and the particles 50 allow a rear-addressed two-color system to be fabricated having white as one of the colors. Further, it is contemplated that the particles 50 and the smaller electrode 30 can be different colors. In these embodiments, a two-color display may be fabricated having a second color that is different from the color of the smaller electrode 30 and the particles 50. For example, a rear-addressed, orange-white display may be fabricated by providing blue particles 50, a red, smaller electrode 30, and a white (or highly reflective) larger electrode 40. In general, the optical properties of the electrodes 30, 40 and the particles 50 can be independently selected to provide desired display characteristics. In some embodiments the optical properties of the dispersing fluid 25 may also be varied, e.g. the fluid 25 may be dyed.

Figure 2A:
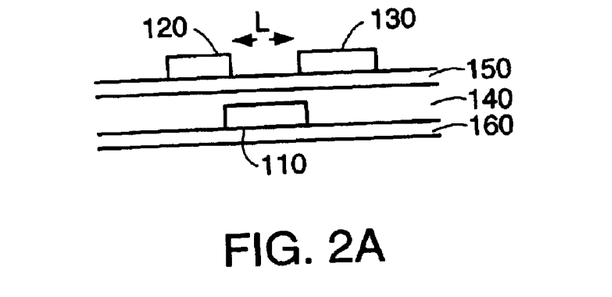
Figure 2B:
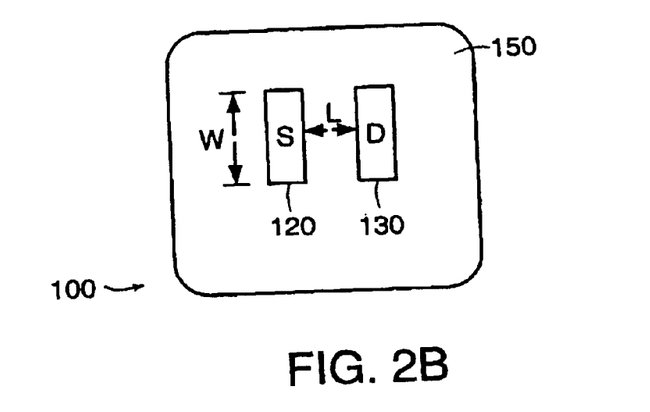
FIG. 2B shows in top view, an example of a field effect transistor, wherein the dimensions of a source electrode and a drain electrode define the channel length, L, and channel width, W.

Referring to FIG. 2A, a field effect transistor 100 having a channel length, L, and a channel width, W, is shown in cross section. FIG. 2B shows the FET from the top. The FET has gate electrode 110, source electrode 120, and drain electrode 130. As viewed from the side, in one embodiment, the FET can have a substrate 160, upon which the gate 110 is disposed. An insulator 140 is disposed adjacent the gate 110 and the substrate 160. A semiconductor 150 is disposed adjacent the insulator 140 on a side of the insulator 140 opposite the gate 110. The source electrode 120 and the drain electrode 130 are disposed adjacent the semiconductor 150, defining the width and length of the channel. Other structures having alternative sequences of the various layers that provide equivalent FET behavior can be constructed. For example, the source 120 and drain 130 can be disposed adjacent the substrate 160, the semiconductor 150 layer can be disposed adjacent the substrate 160 and the source 120 and drain 130 electrodes, the insulator 140 can be disposed adjacent the semiconductor 150, and the gate electrode 110 can be disposed adjacent the insulator 140.

When the FET is used as a switch, either the source 120 or the drain 130 can be used to supply a controlled signal to a device such as a display element, or a pixel. Therefore, one of the source 120 and drain 130 electrodes can be an electrode used to address a pixel, and can be referred to as a pixel electrode. As will become apparent from the discussion hereafter, the other electrode can be connected to a data line, and can be referred to as a data line electrode.

In designing a TFT at a display pixel, one needs to choose a construction that will give sufficient current to drive the electro-optical material in the associated pixel in the time allotted by the driving protocol. This typically means that the magnitude of the current through the TFT channel in full saturation meets the needs of the pixel. After choice of FET gate insulator, drive voltage, material (and associated field effect mobility and threshold voltage), the saturation current is determined by the ratio W/L. Those of ordinary skill will recognize that the formula shown in equation (1) is an approximation that is accurate for many purposes. The designer of the backplane should choose W/L so that the display functions properly.

Active matrix backplanes have successfully been fabricated using traditional silicon processing technologies for driving liquid crystal displays. These photolithographic processing technologies permit the definition of fine features, including a small channel length L, and an associated large ratio W/L. Alternate methods for fabricating backplanes are promising because they involve lower cost processing methods. Such methods include printing techniques such as screen printing, ink jet printing, flexo-gravure printing, offset printing or photopatterning of thin films. However, the resolution limits of these techniques currently are not as small as the limits for silicon processing techniques, so that the features such as gaps and lines must be larger than for a backplane developed using traditional silicon processing techniques. This means, for one thing, that the channel length (L) cannot be as small as can be achieved using traditional silicon processing. To achieve the same saturation current from a TFT using a larger channel length one needs to increase the channel width, W, accordingly so that the ratio W/L remains constant. If the channel width that is required by the ratio exceeds the dimension of the side of a pixel then the traditional design becomes problematic.

The invention relates to making printed transistors using much longer channel lengths, of at least 10 microns, preferably 25 microns, to as high as several hundred microns, while achieving desirable display characteristics, including acceptable electrical performance of the pixel transistor and maintaining a large aperture ratio, which is the fraction of the display active area that is covered by pixel, or display, electrodes. This design is advantageous because it enables the use of conventional printing methods, such as screen printing, ink jet printing, printing through a stencil, flexo-gravure printing and offset printing. It also permits driving electro-optic materials that require much current, such as light-emitting diodes.

Figure 3:
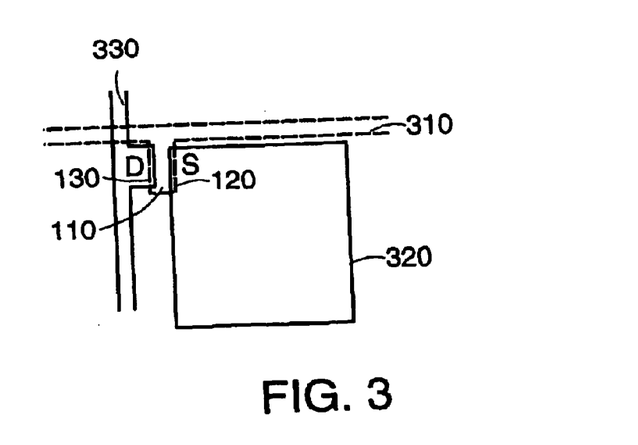
FIG. 3 shows in plan view an exemplary embodiment of a thin film field effect transistor that is fabricated adjacent an associated pixel.

FIG. 3 shows the traditional design of a pixel 200 in an active matrix display where the TFT resides adjacent to the pixel electrode. In FIG. 3, the pixel area is defined by an electrode that can be called a pixel or display electrode 320. In FIG. 3, the upper left portion of display electrode 320 is the source 120 electrode of a TFT. The drain 130 electrode of the TFT is connected to a data line 330, and the gate 110 electrode of the TFT is connected to a select line 310. In operation, the information ("data") that the pixel is intended to display is presented as a voltage signal on the data line 330. The connection of the data line 330 to the pixel or display 320 electrode is accomplished by applying a control ("selection") voltage to the select line 310, which voltage is communicated to the gate 110 electrode. The select line 310 voltage either closes the TFT switch, communicating the data line 330 signal to the display electrode 320 via the drain 130 and the source 120, or causes the TFT to be open, communicating no signal to the pixel or display electrode 320.

Figure 4A:
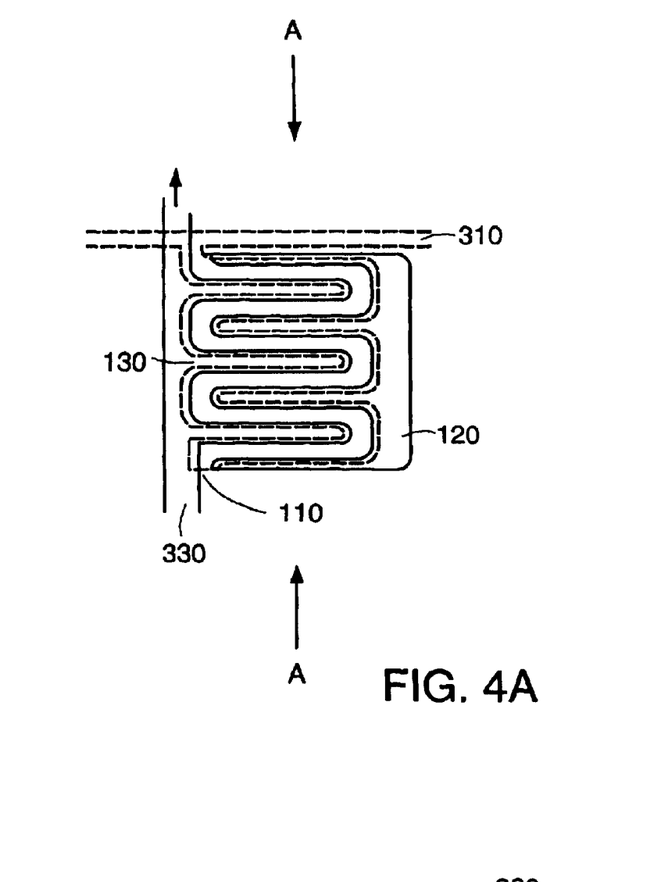
Figure 4B:
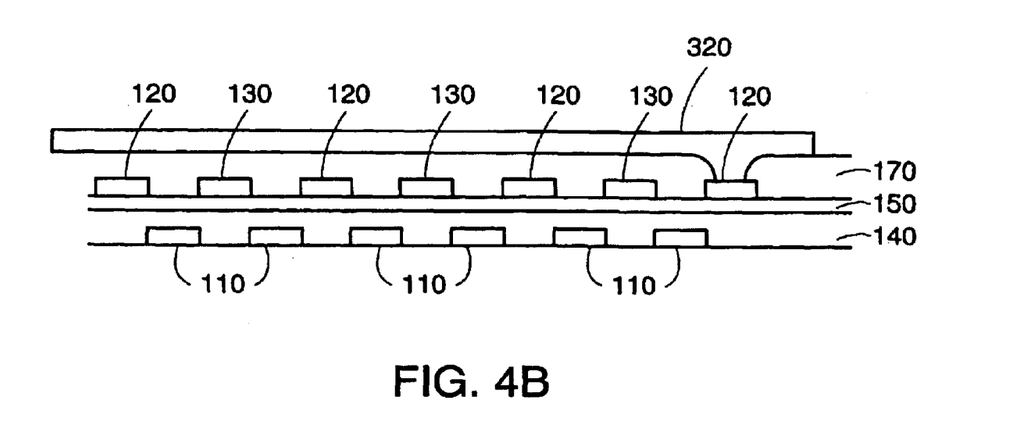
FIG. 4B shows in elevation along the section A—A, an embodiment of a TFT having interdigitated pixel and data line electrodes, according to the principles of the invention.

FIG. 4 shows an example of an embodiment 400 of the invention. FIG. 4A shows an exemplary design of interdigitated source 120 and drain 130 electrodes. FIG. 4B shows an elevation along the section A—A. As may be seen from the side view in FIG. 4B, the transistor is placed substantially below the pixel electrode 320 in order to maintain a large aperture ratio (the fraction of the display active area covered by pixel electrodes). In the present embodiment, the source 120 and drain 130 electrodes are separated from the pixel electrode 320 by an insulating layer 170 except where the source 120 is electrically connected to the pixel electrode 320.

This electrical connection may be accomplished in at least two ways. First, a via may be cut, drilled, or otherwise formed through the insulating layer 170 that separates the source 120 and drain 130 from the pixel electrode 320. When the pixel electrode 320 material is applied, this material fills the via, thereby establishing electrical connection between the source 120 and pixel electrode 320. In the preferred second embodiment, the insulating layer 170 separating the source 120 and drain 130 electrodes from the pixel electrode 320 is patterned such that a portion of the source 120 electrode is left exposed. When the pixel electrode 320 material is then applied, it fills the exposed area, thereby establishing electrical connection between the source 120 and pixel electrode 320. The insulating layer 170 may be either a thin or thick film, but is preferably a thick film to ensure satisfactory electrical isolation between the electrodes and to ensure compatibility with the lower resolution printing techniques discussed above.

Placing the transistor substantially below the pixel electrode has an additional advantage: the semiconductor channel is shielded by the insulating layer 170 and the pixel electrode 320 from light that may pass through the display medium. Optical shielding of the constituent materials is especially important for organic semiconductors, which are known to be photoactive. In one embodiment, for example as shown in FIG. 4A in plan view, the TFT can have a channel defined by interdigitated fingers on the drain 130 and pixel 120 electrodes, giving a larger W/L than what is possible if the TFT resided only along one or more edges of the pixel. This is not the only possible design. As one alternative; the TFT channel could be defined in ways other than this rectilinear form. Other forms for the TFT channel geometry include co-spiraling drain 130 and source 120 electrodes, and ones where the drain electrode 130 has branches in two directions. Generally, any geometry where the channel is substantially under the pixel electrode 320 is contemplated, and especially those where the channel takes a geometry other than a simple rectangle. These designs are advantageous because they allow for maintaining a larger W/L ratio with a larger channel length L than for a TFT constrained to lie adjacent to the pixel electrode 320. This permits the use of printing and other techniques for fabricating display backplanes that are not capable of attaining the fine resolution limits of standard silicon processing using photolithography. Also, these designs achieve large W and large L without reducing the aperture ratio of the display. These designs are especially advantageous when using a semiconductor with a relatively small carrier mobility, for example, an organic semiconductor such as regioregular poly(3-hexyl thiophene). Other materials that can be employed are polythiophene, poly(3-alkylthiophene), alkyl-substituted oligothiophene, polythienylenevinylene, poly(para-phenylenevinylene) and doped versions of these polymers. An example of a suitable oligomeric semiconductor is alpha-hexathienylene. Horowitz, *Organic Field-Effect Transistors*, Adv. Mater., 10, No. 5, p. 365 (1998) describes the use of unsubstituted and alkyl-substituted oligoth-iophenes in transistors. A field effect transistor made with regioregular poly(3-hexylthiophene) as the semiconductor layer is described in Bao et al., *Soluble and Processable Regioregular Poly(3-hexylthiophene)for Thin Film Field-Effect Transistor Applications with High Mobility*, Appl. Phys. Lett. 69 (26), p. 4108 (December 1996). A field effect transistor made with α-hexathienylene is described in U.S. Pat. No. 5,659,181.

Such a transistor could be used in construction of a backplane in one of various electronic displays, including electrophoretic, suspended ball or needle, bichromal ball (gyricon), light emitting diode, electroluminescent, plasma discharge, or liquid crystal displays. In principal, any display where an optical state is changed by application of a voltage or current could be designed using the pixel transistor described in detail herein. The exemplary embodiment shown in FIG. 4 makes good use of the available space under the pixel electrode 320 in order to give a large channel width W. The exemplary embodiment of FIG. 4 is fabricated in a sequence of depositions of material similar to that described with respect to FIG. 2. As was discussed in connection with FIG. 2, alternative methods of constriction can be envisioned.

Figure 5A:
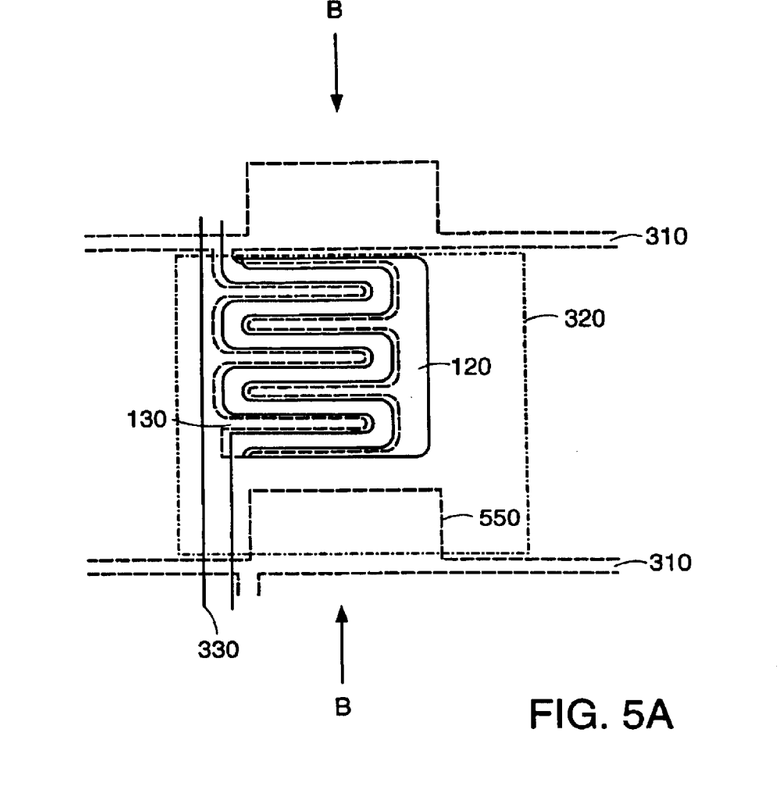
Figure 5B:
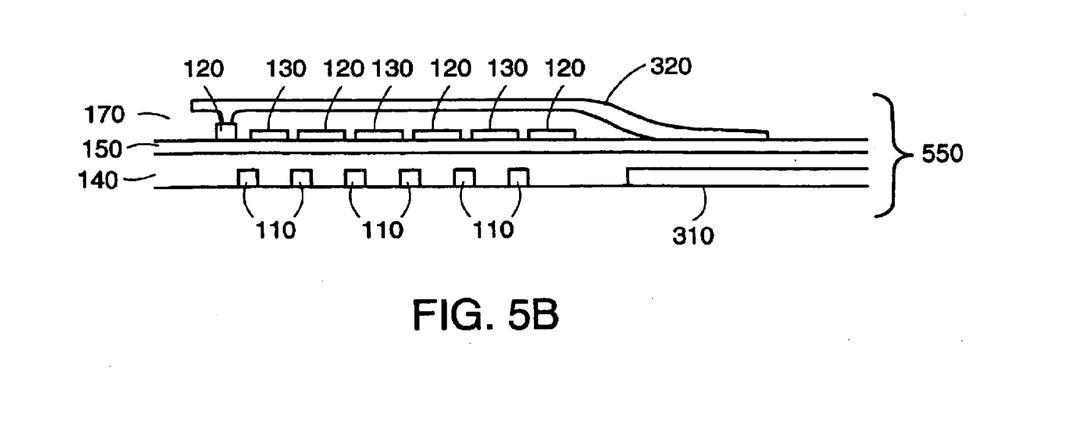
FIG. 5B shows in elevation along the section B—B, an embodiment of a TFT having interdigitated pixel and data line electrodes and a capacitor comprising a pixel electrode and a select line, according to the principles of the invention.

FIG. 5 shows an exemplary pixel design 500 incorporating a storage capacitor 550. FIG. 5A shows in plan view the exemplary pixel or display electrode 320 having an overlap with a portion of the select line 310 used to drive another pixel. FIG. 5B shows the exemplary pixel in elevation or side view taken along section B—B of FIG. 4A. The storage capacitor 550 is formed by an overlap between a pixel electrode 320 and an adjacent select line 310 not being used to drive the pixel. The insulator layer 170 is made thinner over the region that forms the storage capacitor 550. In an alternative embodiment, the insulator layer 170 is absent from the storage capacitor 550. The exemplary embodiment of FIG. 5 is fabricated in a sequence of depositions of material similar to that described with respect to FIG. 2. As was discussed in connection with FIG. 2, alternative methods of construction can be envisioned.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An electronic display drive circuit comprising:
   a pixel electrode;
   a data line electrode;
   an insulator disposed adjacent the pixel electrode; and
   a transistor placed adjacent the insulator on a side thereof opposite the pixel electrode for addressing the pixel electrode, the transistor comprising a channel defined by a source electrode and a drain electrode, the channel having a length, L, defined as a distance between the source and drain electrodes, and a channel width, W, defined as an effective lateral length measured along the source and drain electrodes, the transistor further comprising a semiconductor layer adjacent the pixel electrode and the data line electrode, a gate electrode and a gate dielectric separating the semiconductor layer from the gate electrode;
   wherein the channel has a non-rectangular shape that allows a greater channel length than a rectangular channel between the source and drain electrodes, the pixel electrode covers at least most of the channel, and the insulator insulates the source electrode and the drain electrode of the transistor from the pixel electrode except for a region of electrical contact between the source electrode of the transistor and the pixel electrode.

2. The electronic display drive circuit of claim 1 wherein the semiconductor layer comprises an organic semiconductor layer.

3. The electronic display drive circuit of claim 1 wherein the length of the channel measures substantially 10 micrometers or more.

4. The electronic display drive circuit of claim 1 wherein the insulator is at least 5 micrometers thick.

5. The electronic display drive circuit of claim 1 further comprising a plurality of data lines and select lines, wherein extensions of the data lines form a plurality of drain electrodes and extensions of the select lines form a plurality of gate electrodes.

6. The electronic display drive circuit of claim 1 wherein the channel jointly defined by the source electrode and the drain electrode has a spiral shape.

7. The electronic display drive circuit of claim 1 further comprising a storage capacitor comprising a portion of the pixel electrode and a portion of a select line.

8. The electronic display drive circuit of claim 1 further comprising a display media comprising one of electrophoretic particles, rotating balls, suspended needles, bichromal spheres, liquid crystals, electroluminescent particles, and a light emitting diode.

* * * * *